United States Patent
Goto et al.

(10) Patent No.: US 12,213,286 B2
(45) Date of Patent: Jan. 28, 2025

(54) HEAT DISSIPATION MEMBER AND METHOD OF MANUFACTURING THE SAME

(71) Applicant: DENKA COMPANY LIMITED, Tokyo (JP)

(72) Inventors: Daisuke Goto, Omuta (JP); Hiroaki Ota, Omuta (JP)

(73) Assignee: DENKA COMPANY LIMITED, Tokyo (JP)

( * ) Notice: Subject to any disclaimer, the term of this patent is extended or adjusted under 35 U.S.C. 154(b) by 667 days.

(21) Appl. No.: 17/423,429

(22) PCT Filed: Jan. 29, 2020

(86) PCT No.: PCT/JP2020/003089
§ 371 (c)(1),
(2) Date: Jul. 15, 2021

(87) PCT Pub. No.: WO2020/158774
PCT Pub. Date: Aug. 6, 2020

(65) Prior Publication Data
US 2022/0104400 A1  Mar. 31, 2022

(30) Foreign Application Priority Data

Jan. 30, 2019 (JP) ................. 2019-013762

(51) Int. Cl.
*H05K 7/20* (2006.01)
*C04B 35/565* (2006.01)
(Continued)

(52) U.S. Cl.
CPC ....... *H05K 7/20409* (2013.01); *C04B 35/565* (2013.01); *C04B 35/622* (2013.01);
(Continued)

(58) Field of Classification Search
CPC . C04B 38/02; C04B 38/00; C04B 2235/3418; C04B 2235/5436;
(Continued)

(56) References Cited

U.S. PATENT DOCUMENTS 6,447,894 B1 9/2002 Hirotsuru et al.
6,914,321 B2 7/2005 Shinohara
(Continued)

FOREIGN PATENT DOCUMENTS

CN 1977378 A 6/2007
CN 101361184 A 2/2009
(Continued)

OTHER PUBLICATIONS

Feb. 25, 2022 Extended Search Report issued in European Patent Application No. 20748646.5.
(Continued)

*Primary Examiner* — Michael E. La Villa
(74) *Attorney, Agent, or Firm* — Oliff PLC

(57) ABSTRACT

A plate-shaped heat dissipation member includes a metal-silicon carbide composite containing aluminum or magnesium, in which at least one of two main surfaces of the heat dissipation member is curved to be convex in an outward direction of the heat dissipation member, and when a flatness of the one main surface defined by JIS B 0621 is represented by $f_1$ and a flatness of the other main surface different from the one main surface defined by JIS B 0621 is represented by $f_2$, $f_2$ is less than $f_1$ by 10 μm or more.

15 Claims, 2 Drawing Sheets

(51) Int. Cl.
    *C04B 35/622*     (2006.01)
    *C04B 38/02*     (2006.01)
    *C04B 41/00*     (2006.01)
    *C04B 41/51*     (2006.01)
    *C04B 41/52*     (2006.01)
    *C04B 41/88*     (2006.01)
    *C04B 41/90*     (2006.01)
    *C22C 29/06*     (2006.01)
    *C22C 32/00*     (2006.01)
    *F28F 3/00*     (2006.01)
    *F28F 13/18*     (2006.01)
    *F28F 21/02*     (2006.01)
    *F28F 21/08*     (2006.01)
    *H01L 23/36*     (2006.01)
    *H01L 23/367*     (2006.01)
    *H01L 23/373*     (2006.01)

(52) U.S. Cl.
CPC ............ *C04B 38/02* (2013.01); *C04B 41/009* (2013.01); *C04B 41/5155* (2013.01); *C04B 41/52* (2013.01); *C04B 41/88* (2013.01); *C04B 41/90* (2013.01); *C22C 29/065* (2013.01); *C22C 29/067* (2013.01); *C22C 32/0063* (2013.01); *F28F 3/00* (2013.01); *F28F 13/185* (2013.01); *F28F 21/02* (2013.01); *F28F 21/084* (2013.01); *H01L 23/36* (2013.01); *H01L 23/367* (2013.01); *H01L 23/3736* (2013.01); *H05K 7/20481* (2013.01); *H05K 7/20845* (2013.01); *C04B 2235/3418* (2013.01); *C04B 2235/5436* (2013.01); *C04B 2235/602* (2013.01); *C04B 2235/656* (2013.01); *C04B 2235/6567* (2013.01); *C04B 2235/6583* (2013.01); *Y10T 428/12007* (2015.01); *Y10T 428/12049* (2015.01); *Y10T 428/12056* (2015.01); *Y10T 428/12063* (2015.01); *Y10T 428/12486* (2015.01); *Y10T 428/12576* (2015.01); *Y10T 428/12729* (2015.01); *Y10T 428/12736* (2015.01); *Y10T 428/12993* (2015.01); *Y10T 428/26* (2015.01)

(58) Field of Classification Search
CPC ........ C04B 2235/606; C04B 2235/656; C04B 2235/6567; C04B 2235/6583; C04B 41/90; C04B 41/009; C04B 41/5155; C04B 41/52; C04B 41/88; C04B 41/4541; C04B 41/5144; C04B 41/4521; C04B 41/4523; C04B 41/5096; C04B 41/515; C04B 35/565; C04B 35/622; F28F 3/00; F28F 13/185; F28F 21/02; F28F 21/084; H01L 23/36; H01L 23/367; H01L 23/3736; H05K 7/20481; H05K 7/20845; H05K 7/20409; C22C 29/065; C22C 29/067; C22C 32/0063; Y10T 428/12007; Y10T 428/12049; Y10T 428/12056; Y10T 428/12063; Y10T 428/12486; Y10T 428/12576; Y10T 428/12729; Y10T 428/12736; Y10T 428/12993; Y10T 428/26

See application file for complete search history.

(56) References Cited

U.S. PATENT DOCUMENTS

| | | | |
|---|---|---|---|
| 10,032,648 | B2 | 7/2018 | Oohiraki et al. |
| 2002/0113302 | A1 | 8/2002 | Shinohara |
| 2007/0248829 | A1 | 10/2007 | Iwamoto et al. |
| 2009/0092793 | A1 | 4/2009 | Hirotsuru et al. |
| 2009/0280351 | A1 | 11/2009 | Hirotsuru et al. |
| 2011/0139399 | A1 | 6/2011 | Itakura et al. |
| 2013/0328184 | A1 | 12/2013 | Iwayama et al. |
| 2014/0182824 | A1 | 7/2014 | Hirotsuru et al. |
| 2016/0254209 | A1 | 9/2016 | Oohiraki et al. |
| 2017/0162469 | A1 | 6/2017 | Kino et al. |
| 2017/0236767 | A1 | 8/2017 | Miyakawa et al. |
| 2017/0317007 | A1 | 11/2017 | Goto et al. |
| 2019/0297725 | A1 | 9/2019 | Wayama et al. |
| 2020/0373251 | A1 | 11/2020 | Hirotsuru et al. |
| 2021/0296204 | A1* | 9/2021 | Yumoto ............. H01L 23/3733 |

FOREIGN PATENT DOCUMENTS

| | | |
|---|---|---|
| CN | 101427367 A | 5/2009 |
| CN | 103443315 A | 12/2013 |
| CN | 103733331 A | 4/2014 |
| CN | 205752140 U | 11/2016 |
| CN | 106796920 A | 5/2017 |
| CN | 106796925 A | 5/2017 |
| EP | 2 690 186 A1 | 1/2014 |
| EP | 3595001 A1 | 1/2020 |
| JP | 2002-246515 A | 8/2002 |
| JP | 3468358 B2 | 11/2003 |
| JP | 2011-129577 A | 6/2011 |
| JP | 6591113 B1 | 10/2019 |
| WO | 2015/053316 A1 | 4/2015 |
| WO | 2015/115649 A1 | 8/2015 |
| WO | 2018/105297 A1 | 6/2018 |
| WO | 2018/163864 A1 | 9/2018 |
| WO | 2019/026836 A1 | 2/2019 |

OTHER PUBLICATIONS

Nov. 18, 2021 Chinese Office Action and Search Report issued in Chinese Patent Application No. 202080006024.1.
May 11, 2022 Supplemental Search Report issued in Chinese Patent Application No. 202080006024.1.
Apr. 21, 2020 Search Report issued in International Patent Application No. PCT/JP2020/003089.

* cited by examiner (a)

(b)

(c)

HEAT DISSIPATION MEMBER AND METHOD OF MANUFACTURING THE SAME

TECHNICAL FIELD

The present invention relates to a heat dissipation member and a method of manufacturing the same. More specifically, the present invention relates to a plate-shaped heat dissipation member including a metal-silicon carbide composite containing aluminum or magnesium and a method of manufacturing the same.

BACKGROUND ART

Recently, as a heat dissipation component for a power module in an electric vehicle or an electric railway, a heat dissipation member formed of a metal-silicon carbide composite has been used instead of copper in the related art.

As the metal of the metal-silicon carbide composite, aluminum or an alloy thereof is used frequently.

In many cases, the heat dissipation member is used in a state where it is joined to another component (for example, a heat dissipation fin or a heat dissipation unit, and characteristics of the junction portion are important.

For example, when the heat dissipation member is joined to a heat dissipation fin or a heat dissipation unit, in general, the heat dissipation member is screwed and fixed to the heat dissipation fin, the heat dissipation unit, or the like using a hole provided in a peripheral portion of the heat dissipation member. However, when a surface of the heat dissipation member in contact with the heat dissipation fin or the like is concave or when many fine uneven portions are present, a gap may be formed between the heat dissipation member and the heat dissipation fin or the like, and there is a problem in that heat transference deteriorates.

In consideration of the above-described problem, some heat dissipation members are disclosed in which a surface joined to a heat dissipation fin or the like is curved to be convex to prevent the formation of a gap between the heat dissipation member and the heat dissipation fin or the like as far as possible.

The reason for this is follows. As described above, typically, the heat dissipation member is used in a state where it is fixed to the heat dissipation fin or the like with a fixing member such as a screw. Therefore, by forming the surface joined to the heat dissipation fin or the like to be curved to be convex, the joined surface is "appropriately flat" during fixing with the fixing member, and joinability (adhesion) to the heat dissipation fin or the like is improved.

For example, Patent Document 1 discloses a plate-shaped silicon carbide composite in which a porous silicon carbide compact is impregnated with a metal containing aluminum as a main component, four or more hole portions for screwing a convex surface of the plate-shaped composite to another heat dissipation component are provided in a surface of the plate-shaped composite, and a relationship between a warpage (Cx: μm) per 10 cm in a hole-to-hole direction (X direction) and a warpage (Cy: μm) per 10 cm in a direction (Y direction) perpendicular thereto is 50≤Cx≤250 and −50≤Cy≤200 (excluding Cy=0).

In another example, Patent Document 2 discloses a plate-shaped silicon carbide composite in which a porous silicon carbide compact is impregnated with a metal containing aluminum as a main component, and a warpage per 10 cm of a main surface of the composite is 250 μm or less.

RELATED DOCUMENT

Patent Document

[Patent Document 1] Japanese Patent Application No. 3468358
[Patent Document 2] Pamphlet of International Publication No. WO2015/115649

SUMMARY OF THE INVENTION

Technical Problem

As described above, it is known that, (1) by manufacturing a curved heat dissipation member first and then (2) "flattening" the curve with a force of a screw during joining to the heat dissipation fin or the like, joinability between the heat dissipation member and the heat dissipation fin or the like is improved and further heat dissipation is improved.

However, typically, a surface of the heat dissipation member opposite to the surface in contact with the heat dissipation fin or the like is connected to a component such as a power element. Therefore, when the component is connected to the curved heat dissipation member, in particular, in a mass-production stage, alignment may be difficult or the connection of the component itself may be difficult.

That is, when the component is connected to a single surface of the curved heat dissipation member to manufacture a power module or the like, there is a room for improvement from the viewpoint of manufacturing stability (for example, yield).

The present invention has been made under these circumstances.

One object of the present invention is to improve manufacturing stability (for example, yield) when a component is connected to a single surface of a curved heat dissipation member to manufacture a power module or the like.

Solution to Problem

The present inventors conducted a thorough investigation in order to achieve the above-described object. As a result, it was found that flatness or the like of two main surfaces of a plate-shaped heat dissipation member defined by JIS B 0621 has a close relationship with the achievement of the object. Based on this finding, the present invention provided below was completed.

According to the present invention,
there is provided a plate-shaped heat dissipation member including a metal-silicon carbide composite containing aluminum or magnesium,
in which at least one of two main surfaces of the heat dissipation member is curved to be convex in an outward direction of the heat dissipation member, and
when a flatness of the one main surface defined by JIS B 0621 is represented by $f_1$ and a flatness of the other main surface different from the one main surface defined by JIS B 0621 is represented by $f_2$, $f_2$ is less than $f_1$ by 10 μm or more.

In addition, according to the present invention,
there is provided a method of manufacturing the above-described heat dissipation member, the method including:
a step of preparing a plate-shaped metal-silicon carbide composite containing aluminum or magnesium; and a step of mechanically processing apart of at least one surface of the composite to provide the one main surface.

Advantageous Effects of Invention

According to the present invention, manufacturing stability (for example, yield) can be improved when a component is connected to a single surface of a curved heat dissipation member to manufacture a power module or the like.

BRIEF DESCRIPTION OF THE DRAWINGS

The above-described object, other objects, characteristics, and advantageous effects will be further clarified using preferred embodiments described below and the accompanying drawings below.

DESCRIPTION OF EMBODIMENTS

Figure 1:
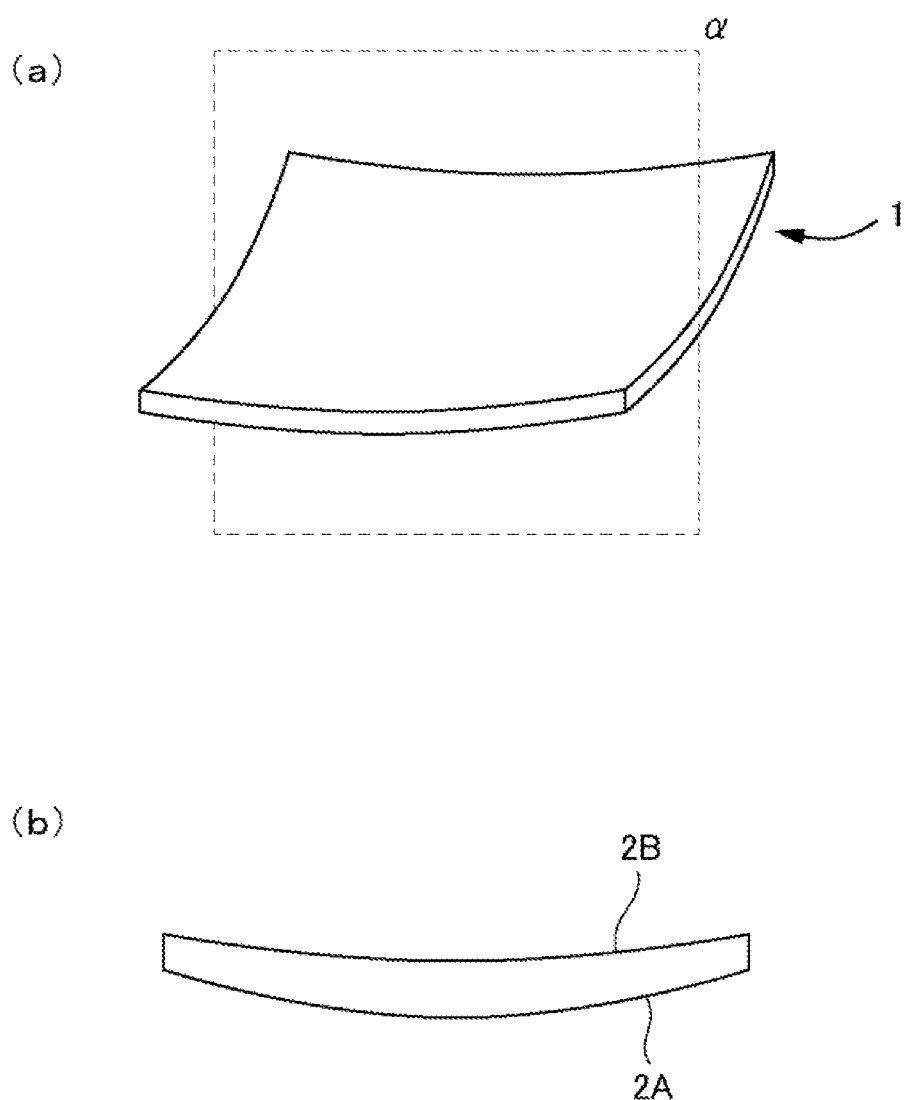
FIG. 1 is a schematic diagram showing a heat dissipation member according to an embodiment, in which (a) is a bird's eye view showing the heat dissipation member according to the embodiment and (b) is a cross-sectional view of the heat dissipation member taken along a cross-section α of (a).

Hereinafter, embodiments of the present invention will be described in detail with reference to the drawings.

In all the drawings, the same components are represented by the same reference numerals, and the description thereof will not be repeated.

Figure 2:
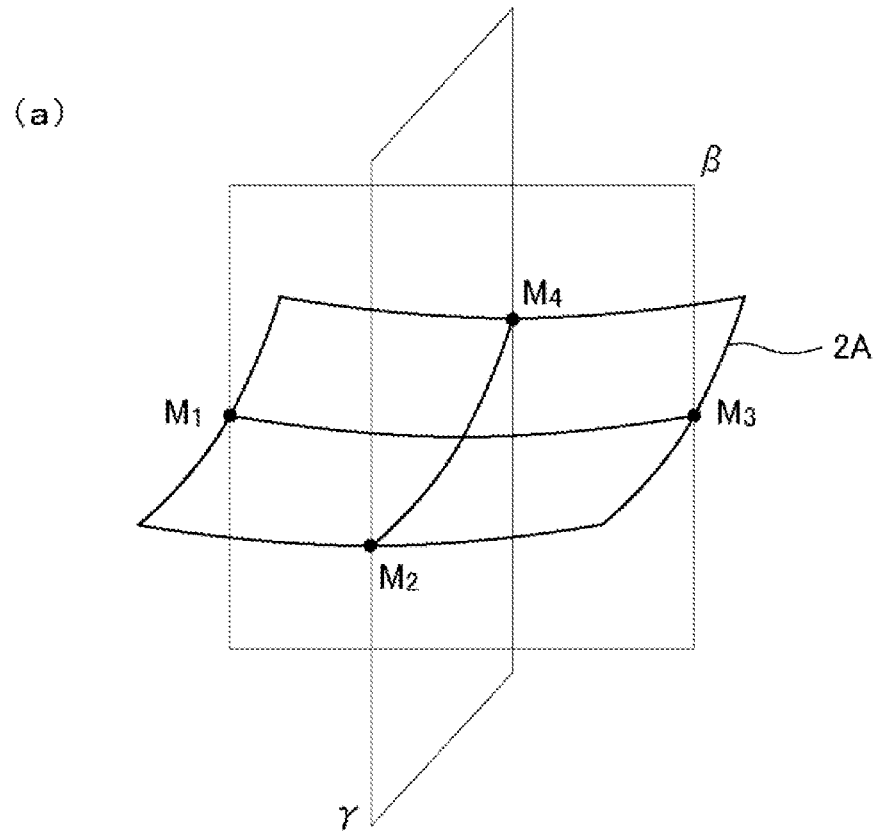
FIG. 2 is a diagram particularly showing at least one of two main surfaces of the heat dissipation member according to the embodiment, in which (a) shows only one of two main surfaces of the heat dissipation member, (b) is a cross-sectional view of the one main surface taken along a cross-section β of (a), and (c) is a cross-sectional view of the one main surface taken along a cross-section γ of (a).
Figure 2:
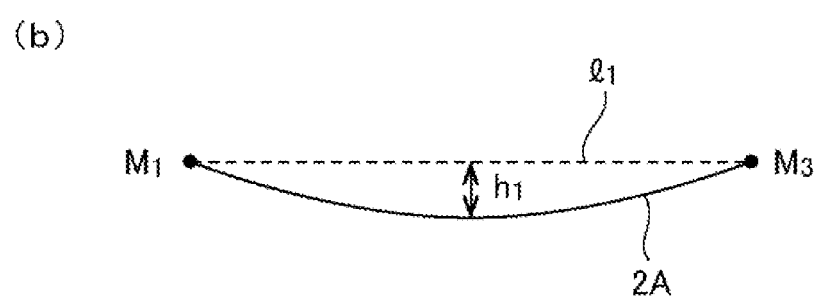
Figure 2:
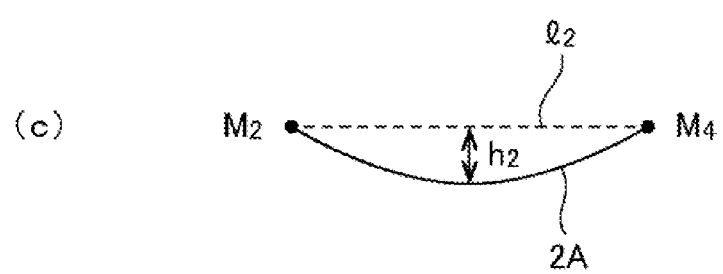

In order to avoid complication, (i) when a plurality of the same components are present on the same drawing, there may be a case where the reference numeral is given to only one component without giving the reference numeral to all the components; and (ii) in the drawings after FIG. 2, there may be a case where the reference numeral is not given again to the same components as those of FIG. 1.

All the drawings are merely illustrative. The shapes, a dimensional ratio, and the like of each of members in the drawings do not necessarily correspond to those of an actual product. In particular, for easy understanding of the description, a shape or a dimensional ratio may be shown in an exaggerated manner. In particular, in each of the drawings, the size of "curve" is more exaggerated than the actual product.

In the present specification, unless explicitly specified otherwise, the term "substantially" in the present specification is intended to include a range defined in consideration of manufacturing tolerances, assembly variations, and the like.

Unless specified otherwise, a value measured at room temperature (23° C.) can be adopted as a value that is variable depending on temperatures among various numerical values (in particular, measured values) in the present specification.

<Heat Dissipation Member>

(a) of FIG. 1 is a bird's eye view showing a heat dissipation member (heat dissipation member 1) according to an embodiment.

The heat dissipation member 1 is plate-shaped.

A main material of the heat dissipation member 1 is a metal-silicon carbide composite containing aluminum or magnesium (the details of the material will be described below together with a method of manufacturing the heat dissipation member 1).

Typically, the heat dissipation member 1 can be made to be substantially rectangular. That is, the heat dissipation member 1 is substantially rectangular in a top view where one main surface is a top surface.

Here, "being substantially rectangular" represents that at least one of four corners of the heat dissipation member 1 may have a slightly rounded shape without being linear (of course, the four corners may be linear).

Supplementarily, at least one of the four corners of the heat dissipation member 1 is processed in a rounded shape, an intersection point when straight line portions of a short side and a long side of the heat dissipation member 1 in the top view are extended can be defined as "apex". In addition, at this time, "the length of the short side" or "the length of the long side" of the heat dissipation member 1 can be defined by using the above-described "apex" as a starting point or an end point.

The lengths of the heat dissipation member 1 are, for example, about in a range of 40 mm×90 mm to 250 mm×140 mm.

The thickness of the heat dissipation member 1 is, for example, 2 mm or more and 6 mm or less and preferably 3 mm or more and 5 mm or less. If the thickness of the heat dissipation member 1 is not uniform, it is preferable that the thickness of at least a center-of-gravity portion of the heat dissipation member 1 is in the above-described range.

(b) of FIG. 1 is a cross-sectional view of the heat dissipation member 1 taken along a surface a of (a) of FIG. 1.

The plate-shaped heat dissipation member 1 includes two main surfaces (one main surface will be referred to as "main surface 2A", and the other main surface will be referred to as "main surface 2B"). Typically, the main surface 2A is a surface to be joined to a heat dissipation fin or the like, and the main surface 2B is a surface to be connected to a power element or the like.

In the heat dissipation member 1, in particular, at least the main surface 2A is curved to be convex in an outward direction instead of in an inward direction of the heat dissipation member 1. Typically, the main surface 2A is curved to be convex in the outward direction as a whole and does not include a portion that is partially concave. When a flatness of the main surface 2A defined by JIS B 0621 is represented by $f_1$ and a flatness of the main surface 2B defined by JIS B 0621 is represented by $f_2$, $f_2$ is less than $f_1$ by 10 μm or more.

In a curved heat dissipation member in the related art, the degree of curve on the main surface 2A side and the degree of curve on the main surface 2B side are substantially the same in many cases. Accordingly, when the main surface 2B side is connected to a component such as a power element, alignment may be difficult or the connection of the component itself may be difficult.

On the other hand, in the heat dissipation member 1 of FIG. 1, $f_1$ (representing the degree of curve of the main surface 2A) is relatively large, and $f_2$ (representing the degree of curve of the main surface 2B) is relatively small. As a result, on the main surface 2A side, the joinability between the heat dissipation member 1 and a heat dissipation fin or the like can be sufficiently obtained, and thus sufficient heat dissipation can be obtained. Accordingly, on the main surface 2B side, the alignment or the connection of the component can be made to be easier as compared to the heat dissipation member in the related art.

The flatness defined by JIS B 0621 can be defined as a minimum interval between two planes that are geometrically parallel to each other when a planar body is interposed between the two planes.

Examples of a measuring device of the flatness $f_1$ and the flatness $f_2$ include a device VR-3000 manufactured by Keyence Corporation.

In addition, it is preferable that $f_1$ is measured for the main surface 2A as a whole. It is noted that the main surface 2A as a whole may not be included in a field of view of the measuring device depending on the size of the heat dissipation member 1. In this case, $f_1$ is measured such that the center (geometric center of gravity) of the main surface 2A in a top view matches the center of the field of view of the measuring device. At this time, it is preferable that a long side of the main surface 2A that is substantially rectangular and a long side of the field of view (the field of view of the measuring device for the flatness is typically rectangular) are parallel to each other. The same is applicable to the measurement of $f_2$.

The heat dissipation member 1 will be described in more detail.

[Additional Description Regarding $f_1$, $f_2$, Main Surface 2B, and the Like]

In the heat dissipation member 1, $f_2$ may be less than $f_1$ by 10 μm or more, it is preferable that $f_2$ is less than $f_1$ by 50 μm or more, and it is more preferable that $f_2$ is less than $f_1$ by 100 μm or more.

On the other hand, from the viewpoints of easy manufacturing of the heat dissipation member 1 itself, an appropriate amount of curve, and the like, the difference ($f_1-f_2$) between $f_1$ and $f_2$ is preferably 600 μm or less, more preferably 500 μm or less, and still more preferably 400 μm or less.

The value of $f_1$ itself is preferably 100 μm or more and 700 μm or less and more preferably 200 μm or more and 600 μm or less.

The value of $f_2$ itself is preferably 300 μm or less, more preferably 250 μm or less, still more preferably 200 μm or less, and still more preferably 100 μm or less. The lower limit value of $f_2$ may be, for example, 0. In addition, in another example, the lower limit value $f_2$ may be 50 μm or more.

It is presumed that, by appropriately designing the value of $f_1$ itself, the heat dissipation member 1 can be fixed to a heat dissipation fin or the like with good connectivity with an appropriate (not excessively high) fastening force. This leads to further improvement in heat dissipation, a reduction in cracking caused by an excessive force, and the like.

It is presumed that, by appropriately designing the value of $f_2$ itself, the alignment or the connection of the component to be connected to the main surface 2B can be made more simple.

The main surface 2B may be curved to be convex in the outward direction of the heat dissipation member 1. Conversely, that is, the main surface 2B may be curved to be concave in the outward direction of the heat dissipation member 1. From the viewpoint of the curve and the like of the heat dissipation member 1 during the manufacturing of a power device as a final product, it is preferable that the main surface 2B is curved to be concave in the outward direction of the heat dissipation member 1.

More specifically, the main surface 2B is curved to be concave in the outward direction of the heat dissipation member 1, and when the degree of the curve is represented by the flatness, the flatness is preferably 300 μm or less, more preferably 250 μm or less, still more preferably 200 μm or less, and still more preferably 100 μm or less.

Of course, the main surface 2B may be curved to be convex in the outward direction of the heat dissipation member 1. As long as the degree of curve represented by $f_2$ is less than $f_1$ by 10 μm or more, a problem in the connection to a power element or the like can be suppressed.

[Material Forming Main Surfaces 2A and 2B and the Like]

In one aspect, the main surface 2A and/or the main surface 2B (that is, the surface of the heat dissipation member 1) may be a metal-silicon carbide composite containing aluminum or magnesium.

In another aspect, the main surface 2A and/or the main surface 2B (the surface of the heat dissipation member 1) may be a metal layer. For example, it is preferable that the main surface 2A and/or the main surface 2B is a surface metal layer containing aluminum or magnesium. In this case, a portion of the heat dissipation member 1 other than the surface metal layer can be made to be the metal-silicon carbide composite or the like. It is preferable that a metal in the metal surface layer is the same as the metal in the metal-silicon carbide composite. The reason for this is a reason relating to the manufacturing of the heat dissipation member 1 (the method of manufacturing the heat dissipation member 1 will be described below).

It is preferable that a plating layer is provided on the outside further than the above-described surface metal layer. Since a solder is used for the connection to a power element or the like, the plating layer can improve the wettability of the solder.

The plating layer can be made to be, for example, a Ni-containing plating layer.

When the heat dissipation member 1 includes the metal surface layer, the average thickness of the surface metal layer is not particularly limited and is, for example, 10 μm or more and 300 μm or less and preferably 30 μm or more and 150 μm or less.

When the heat dissipation member 1 includes the plating layer, the average thickness of the plating layer is not particularly limited and is, for example, 3 μm or more and 15 μm or less and preferably 4 μm or more and 10 μm or less.

As the value of $f_1$ or $f_2$, in principle, the value of the flatness of the outermost surface of the heat dissipation member 1 is adopted.

For example, when the heat dissipation member 1 is formed of only the plate-shaped metal-silicon carbide composite, the flatness of both main surfaces of the plate-shaped metal-silicon carbide composite can be measured to obtain the value of $f_1$ or $f_2$.

In addition, when the outermost surface of the heat dissipation member 1 is the surface metal layer or the plating layer, the flatness of the surface of the surface metal layer or the plating layer as the outermost surface can be measured to obtain the value of $f_1$ or $f_2$.

[Index Representing Roughness of Surfaces of Main Surfaces 2A and 2B]

In another viewpoint, by appropriately designing "the index representing the roughness of the surfaces" of the main surface 2A and the main surface 2B, the performance such as heat dissipation can be further improved.

For example, it is preferable that an average length $RS_m$ of roughness curve elements of the main surface 2A is designed to be 50 μm or more and 250 μm or less, and it is more preferable that the average length $RS_m$ is designed to be 70 μm or more and 160 μm or less.

By appropriately designing $RS_m$ of the main surface 2A, the joinability to a heat dissipation fin or the like can be further improved, and the heat dissipation can be further improved. The detailed mechanism or the like is not clear but is presumed to be that, by appropriately designing $RS_m$, micro gaps between the heat dissipation member 1 and the heat dissipation fin can be reduced and the joinability can be further improved.

In addition, it is preferable that an average length $RS_m$ of roughness curve elements of the main surface 2B is designed to be 50 μm or more and 200 μm or less, and it is more preferable that the average length $RS_m$ is designed to be 70 μm or more and 160 μm or less.

The reason for this is presumed to be that, by appropriately designing $RS_m$ of the main surface 2B, the connectivity between the heat dissipation member 1 and the power element or the like can be improved.

[Regarding Curve of Main Surface 2A]

FIG. 2 is a diagram showing a configuration of the main surface 2A of the heat dissipation member 1.

(a) of FIG. 2 is a diagram showing only the main surface 2A of the heat dissipation member 1, (b) of FIG. 2 is a cross-sectional view of the main surface 2A taken along a cross-section β of (a) of FIG. 2, and (c) of FIG. 2 is a cross-sectional view of the main surface 2A taken along a cross-section γ of (a) of FIG. 2. In these diagrams, auxiliary lines and the like are shown for the following description.

Here, the length of a long side of the rectangular heat dissipation member 1 is represented by a, the length of a short side of the heat dissipation member 1 is represented by b, a straight line connecting middle points (represented by $M_1$ and $M_3$ in the drawing) of two short sides of the main surface 2A is represented by $l_1$, and a straight line connecting middle points (represented by $M_2$ and $M_4$ in the drawing) of two long sides of the main surface 2A is represented by $l_2$.

In addition, a maximum distance between a point on a curve of the main surface 2A and $l_1$ in a cross-sectional view of the heat dissipation member 1 showing the cross-section β including $l_1$ and substantially perpendicular to the main surface 2A is represented by $h_1$, and a maximum distance between a point on a curve of the main surface 2A and $l_2$ in a cross-sectional view of the heat dissipation member 1 showing the cross-section γ including $l_2$ and substantially perpendicular to the main surface 2A is represented by $h_2$.

At this time, it is preferable that the heat dissipation member 1 is designed such that $h_1/a \geq h_2/b$.

More specifically, the value of $(h_1/a)/(h_2/b)$ is preferably 1.00 or higher and 1.9 or lower and more preferably 1.07 or higher and 1.6 or lower.

The above-described inequality can be interpreted as follows.

It can be said that $h_1/a$ represents "the curve per unit length in a long side direction" of the heat dissipation member 1.

Likewise, it can be said that $h_2/b$ represents "the curve per unit length in a short side direction" of the heat dissipation member 1.

As a result, "$h_1/a \geq h_2/b$" can be interpreted to be that "the degree of curve" in the long side direction is the same as or higher than that in the short side direction in addition to the fact that a long side is longer than a short side.

Although the details are partially unclear, when the curved heat dissipation member 1 is pressed against and joined to another component using a screw, the rectangular (oblong) heat dissipation member 1 is more likely to be deformed (likely to be bent) in the long side direction than in the short side direction. Accordingly, it is presumed that, by designing "the degree of curve" in the long side direction to be higher than that in the short side direction, the heat dissipation member 1 as a whole can be easily flattened even without applying an excessive force (even when the screwing force is relatively low). In addition, it is presumed that, by designing the screwing force to be relatively low, cracking in the vicinity of the screw can be suppressed.

[Hole for Screwing]

It is preferable that the heat dissipation member 1 includes a hole for screwing (not shown in FIGS. 1 and 2).

For example, when the heat dissipation member 1 is substantially rectangular, it is preferable that the hole for screwing (through hole) is provided in peripheral portions of four corners of the heat dissipation member 1. In addition, depending on the length of a long side of the heat dissipation member 1, for example, a hole may be provided in the vicinity of the middle point of the long side in the peripheral portion of the heat dissipation member 1.

The diameter of the hole can be made to be, for example, about 5 mm or more and 9 mm or less.

Just to make sure, a unit that joins the heat dissipation member 1 to another component is not limited to a screw. For example, the heat dissipation member 1 may be joined to another component using a dedicated jig capable of attaching the heat dissipation member 1 to another component.

[Manufacturing Method/Material]

A method of manufacturing the heat dissipation member according to the embodiment is not particularly limited and can be manufactured appropriately using a well-known method.

It is preferable that the heat dissipation member according to the embodiment can be manufactured through steps including: (i) a step of preparing a plate-shaped metal-silicon carbide composite containing aluminum or magnesium; and (ii) a step of mechanically processing (for example, grinding or cutting) a part of at least one surface of the metal-silicon carbide composite to provide the main surface 2A.

The heat dissipation member according to the embodiment includes the metal-silicon carbide composite containing aluminum or magnesium. A method that is preferably used for manufacturing the metal-silicon carbide composite is a high-pressure forging method of impregnating a porous body with a metal at a high pressure. More specifically, squeeze casting or die casting can be adopted. In the high-pressure forging method, a porous silicon carbide body (preform) is charged into a high-pressure container, and is impregnated with molten metal containing aluminum or magnesium at a high pressure to obtain a composite.

For manufacturing the heat dissipation member according to the embodiment, squeeze casting is more preferable due to the reason that a large number of products can be stably manufactured. Hereinafter, the manufacturing method using squeeze casting will be described.

For example, the heat dissipation member according to the embodiment can be manufactured through the following steps:

(Step 1) A step of forming a flat porous silicon carbide body (SiC preform);

(Step 2) a step of mechanically processing at least a single surface of the porous silicon carbide body in a convex curved shape;

(Step 3) a step of impregnating the porous silicon carbide body with a metal (alloy) containing aluminum or magnesium to prepare a metal-silicon carbide composite including a composite portion and a surface metal layer, the composite portion containing silicon carbide and a metal, and the surface metal layer being provided on an outer surface of the composite portion; and (Step 4) a step of mechanically processing at least the surface metal layer on the surface side processed in a convex curved shape to obtain a heat dissipation member in which $f_2$ is less than $f_1$ by 10 μm or more.

(Step 1) to (Step 4) will be described in more detail.

A method of manufacturing the porous silicon carbide body (SiC preform) in (Step 1) is not particularly limited, and the porous silicon carbide body can be manufactured using a well-known method. For example, the porous silicon carbide body can be manufactured by adding silica, alumina, or the like as a binder to silicon carbide (SiC) powder as a raw material, mixing the components, molding and calcinating the mixture at 800° C. or higher.

A molding method is not particularly limited, press molding, extrusion molding, cast molding, or the like can be used. Optionally, a binder for shape retention can be used in combination.

Important characteristics of the metal-silicon carbide composite obtained by impregnating the porous silicon carbide body with a metal containing aluminum or magnesium are thermal conductivity and a thermal expansion coefficient. It is preferable that the SiC content in the porous silicon carbide body is high because the thermal conductivity is high and the thermal expansion coefficient is low. It is noted that, when the content is excessively high, the porous silicon carbide body is not sufficiently impregnated with an aluminum alloy.

In practice, suitably, 40 mass % or higher of coarse SiC particles having an average particle size of preferably 40 μm or more are contained, and the relative density of the SiC preform is preferably in a range of 55% or higher and 75% or lower. The bending strength of the porous silicon carbide body (SiC preform) is preferably 3 MPa or higher in order to prevent fracturing during handling or impregnation. The average particle size can be measured by calculating the average value of particle sizes of 1000 particles using a scanning electron microscope (for example, "JSM-T200 model", manufactured by JEOL Ltd.) and an image analyzer (for example, manufactured by Nippon Avionics Co., Ltd.). In addition, the relative density can be measured using the Archimedes method.

It is preferable that the particle size of the SiC powder as a raw material of the porous silicon carbide body (SiC preform) is adjusted by appropriately using coarse powder and fine powder in combination. As a result, the strength of the porous silicon carbide body (SiC preform) and the thermal conductivity of the heat dissipation member that is finally obtained can be improved at a high level.

Specifically, mixed powder obtained by mixing (i) SiC coarse powder having an average particle size of 40 μm or more and 150 μm or less and (ii) SiC fine powder having an average particle size of 5 μm or more and 15 μm or less is suitable. Here, regarding a ratio between the amount of (i) and the amount of (ii) in the mixed powder, the amount of (i) is 40 mass % or higher and 80 mass % or lower, and the amount of (ii) is preferably 20 mass % or higher and 60 mass % or lower.

The porous silicon carbide body (SiC preform) is obtained by, for example, degreasing and calcinating a compact of a mixture obtained by adding the binder to the SiC powder. When the calcination temperature is 800° C. or higher, a porous silicon carbide body (SiC preform) having a bending strength of 3 MPa or higher is likely to be obtained irrespective of the atmosphere during the calcination.

It is noted that, when the calcination is performed at a temperature exceeding 1100° C. in an oxidizing atmosphere, the oxidation of SiC is promoted, and the thermal conductivity of the metal-silicon carbide composite may decrease. Accordingly, it is preferable that the calcination is performed at a temperature of 1100° C. or lower in the oxidizing atmosphere.

The calcination time may be appropriately determined depending on conditions such as the size of the porous silicon carbide body (SiC preform), the amount of raw materials charged into a calcination furnace, or the calcination atmosphere.

When the porous silicon carbide body (SiC preform) is molded in a predetermined shape, a change in curve caused by drying can be prevented by performing drying one by one or by performing drying using a spacer such as carbon having the same shape as the preform shape between SiC preforms. In addition, by performing the same process as that during drying for the calcination, a shape change caused by a change in internal structure can be prevented.

In (Step 2), at least a single surface of the porous silicon carbide body (SiC preform) is processed in a convex curved shape toward the outside, for example, a cutting and grinding tool such as a lathe. This way, by performing mechanical processing (cutting) at a stage of the preform, it is not necessary to use, for example, a special tool for cutting after the metal impregnation, and there is an advantageous effect in that the degree of curve or the flatness is easy to control.

In the manufacturing of the heat dissipation member according to the embodiment, both surfaces of the porous silicon carbide body (SiC preform) may be processed instead of the single surface. That is, both surfaces of the porous silicon carbide body (SiC preform) may be processed such that, in the finally obtained heat dissipation member, $f_2$ is less than $f_1$ by 10 μm or more and the values of $f_1$ and $f_2$ are desired values.

In (Step 3), the porous silicon carbide body (SiC preform) can be impregnated with a metal containing aluminum or magnesium using a high-pressure forging method to prepare a metal-silicon carbide composite including a composite portion and a surface metal layer, the composite portion containing silicon carbide and a metal, and the surface metal layer being provided on an outer surface of the composite portion.

Examples of a method of obtaining the metal-silicon carbide composite by impregnating the porous silicon carbide body (SiC preform) with the metal (alloy) containing aluminum or magnesium include the following method.

The porous silicon carbide body (SiC preform) is put into a mold, and one or more kinds among fibers, spherical particles, and crushed particles formed of alumina or silica are disposed to be in direct contact with on both plate surfaces of the mold. As a result, one block is obtained.

This block is preheated to 500° C. or higher and 650° C. or lower, and one or two or more blocks are disposed in a high-pressure container. Next, in order to prevent a temperature decrease of the block as rapidly as possible, molten metal containing aluminum or magnesium is pressurized at a pressure of 30 MPa or higher, and the metal is impregnated into voids of the porous silicon carbide body (SiC preform).

As a result, the metal-silicon carbide composite including a composite portion and a surface metal layer is obtained, the composite portion containing silicon carbide and a metal, and the surface metal layer being provided on an outer surface of the composite portion.

It is preferable that the melting point of the metal (typically, the alloy containing aluminum or magnesium) in the metal-silicon carbide composite is as low as possible so as to sufficiently permeate into the voids of the preform during the impregnation.

From this viewpoint, for example, an aluminum alloy containing 7 mass % or higher and 25 mass % or lower of silicon is preferable. Further, it is preferable that 0.2 mass % or higher and 5 mass % or lower of magnesium is contained from the viewpoint that the binding between the silicon carbide powder and the metal portion becomes more strong. Metal components in the aluminum alloy other than aluminum, silicon, and magnesium are not particularly limited within a range where characteristics do not change extremely. For example, copper may be included.

As the aluminum alloy, for example, AC4C, AC4CH, or ADC12 that is an alloy for forging can be preferably used.

In order to remove strain generated during the impregnation, an annealing treatment may be performed after the preparation of the metal-silicon carbide composite. It is preferable that the annealing treatment that is performed in order to remove strain is performed at a temperature of 400° C. or higher and 550° C. or lower for 10 minutes or longer and 5 hours or shorter.

When the annealing temperature is 400° C. or higher, strain in the composite is sufficiently released, and a significant change in curve in the annealing treatment step after mechanical processing can be suppressed. On the other hand, when the annealing temperature is 550° C. or lower, the aluminum alloy used for the impregnation can be prevented from melting.

When the annealing time is 10 minutes or longer, strain in the composite is sufficiently released, and a significant change in curve in the annealing treatment step for removing processing strain after mechanical processing can be suppressed. On the other hand, it is preferable that the annealing time is 5 hours or shorter from the viewpoint of mass productivity or the like.

In addition, in (Step 3), one or more kinds among fibers, spherical particles, and crushed particles formed of alumina or silica can be disposed to be in direct contact with the surface of the porous silicon carbide body (SiC preform). As a result, a surface metal layer having a predetermined thickness can be formed. There is substantially no color unevenness after the impregnation, and there is an advantageous effect in that workability during shaping can be improved.

The content of the material including one or more kinds among fibers, spherical particles, and crushed particles formed of alumina or silica in the surface metal layer is preferably 0.1 mass % or higher and 5 mass % or lower and more preferably 0.3 mass % or higher and 2 mass % or lower with respect to the mass of the metal-silicon carbide composite.

When the content is 0.1 mass % or higher, it is easy to control the thickness of the aluminum layer, and a significant change in curved shape caused by the annealing treatment after processing can be suppressed. In addition, when the content is 5 mass % or lower, the aluminum alloy layer is not excessively hard, and general mechanical processing can be easily performed.

The thickness of the surface metal layer provided on the surface of the metal-silicon carbide composite may be appropriately adjusted such that the difference in thickness between the front and rear surface metal layers after processing is not large irrespective of whether only a heat dissipation surface (corresponding to the main surface 2A in the heat dissipation member 1) or both surfaces are mechanically processed in (Step 4). After the adjustment, the above-described inorganic fiber can be appropriately used.

Specifically, the average thickness of the metal layer on the circuit board mounting surface side (corresponding to the main surface 2B in the heat dissipation member 1) is preferably 10 µm or more and 300 µm or less. In addition, regarding the difference in average thickness between metal-containing layers of both surfaces, it is preferable that the average thickness of the metal-containing layer having a smaller thickness is less than 50% with respect to the average thickness of the metal-containing layer having a larger thickness.

The difference in average thickness between the metal-containing layers of both of the surfaces is adjusted to be preferably less than 40% and more preferably less than 30% with respect to the average thickness of the metal-containing layer of the heat dissipation surface. The reason for this is that a change in curved state depending on a difference in thermal expansion coefficient between the metal-containing layers of both of the surfaces can be suppressed.

In (Step 4), at least the surface metal layer on the surface side processed in a convex curved shape in the metal-silicon carbide composite is mechanically processed and, in some cases, is further annealed to obtain a heat dissipation member in which $f_2$ is less than $f_1$ by 10 µm or more. Specifically, an appropriate curved shape is formed on the heat dissipation surface of the metal-silicon carbide composite using a tool such as a lathe capable of accurate scraping (for example, grinding or cutting). Next, for example, the metal-silicon carbide composite is heated at about 400° C. to 550° C. using a muffle furnace and is annealed for about 2 hours to 6 hours.

In the embodiment, by accurately mechanically processing the surface layer on the surface of the metal-silicon carbide composite, a heat dissipation member in which $f_1$, $f_2$, and the like have desired numerical values can be obtained. In particular, by appropriately mechanically processing (for example, grinding or cutting) not only the surface side of the metal-silicon carbide composite processed in a convex curved shape but also optionally an opposite surface thereof, a heat dissipation member having the desired values of $f_1$, $f_2$, $h_1/a$, $h_2/b$, and the like can be obtained. That is, a heat dissipation member having more satisfactory heat dissipation properties, reliability, and the like can be obtained.

Supplementarily, through a heat treatment such as "annealing" that is performed in (Step 1) to (Step 4) typically, the metal-silicon carbide composite or the heat dissipation member is deformed as a whole. That is, even when a curved shape is formed on only the heat dissipation surface of the metal-silicon carbide composite by grinding, cutting or the like, typically, a certain degree of curve is formed on the surface opposite to the heat dissipation surface through a heat treatment such as annealing (that is, $f_2$ is typically a value other than 0). The degree of deformation by the heat treatment such as annealing can be estimated quantitatively to some extent, for example, by performing a preliminary experiment several times.

In short, in the embodiment, it is preferable that mechanical processing conditions and annealing conditions are appropriately combined in order to obtain a desired heat dissipation member.

The total average thickness of the metal-containing layers of both of the surfaces after mechanical processing is preferably 500 µm or less and more preferably 300 µm or less.

When the total average thickness of the metal-containing layers of both of the surfaces is 500 μm or less, the thermal expansion of the heat dissipation member as a whole is suppressed to be relatively small. As a result, when thermal load is applied, cracking caused by a difference in thermal expansion coefficient between the heat dissipation member and a power element or the like connected to an upper surface thereof can be suppressed.

Just to be safe, of course, the method of manufacturing the heat dissipation member according to the embodiment is not limited to the above-described configuration.

For example, in the heat dissipation member according to the embodiment, the surface metal layer is an optional configuration. Therefore, in (Step 3), the surface metal layer does not need to be formed.

In another example, among (Step 1) to (Step 4), the removal of (Step 2) may be considered. That is, it may be considered to obtain a heat dissipation member having a desired curve or flatness by performing necessary mechanical processing in (Step 4) without performing processing into a curved shape at the stage of the porous silicon carbide body (SiC preform) before impregnating the porous silicon carbide body with the metal. The mechanical processing can be performed more easily before the impregnation with the metal than after the impregnation with the metal. Therefore, from the viewpoint of, for example, reducing manufacturing costs, it is preferable to form the curved shape to some extent at the stage of (Step 2).

In still another example, among (Step 1) to (Step 4), the removal of (Step 4) may be considered. That is, mechanical processing in (Step 4) may be unnecessary by performing curve processing with sufficient accuracy at the stage of (Step 2) to provide desired curve to the mold used for the impregnation in (Step 3). In consideration of a dimensional change caused by heating and cooling during the impregnation with the metal, even if the curve processing is performed with sufficient accuracy at the stage of (Step 2), it is preferable to adjust the curved shape or the flatness by performing (Step 4).

The method of manufacturing the heat dissipation member according to the embodiment may include another step other than the above-described steps.

For example, a step of providing the hole for screwing may be provided. For example, between (Step 3) and (Step 4), the hole for screwing for joining to another component may be provided in the metal-silicon carbide composite by mechanical processing or the like. By providing the hole for screwing between (Step 3) and (Step 4), there is an advantageous effect in that the hole can be used when the metal-silicon carbide composite is fixed to a cutting and grinding tool in (Step 4).

In addition, a step of polishing or blasting the surface of the heat dissipation member may be performed after (Step 4). As a result, for example, the above-described average length $RS_m$ of the roughness curve elements can be appropriately adjusted. As a specific method of the polishing treatment or the blasting treatment, a well-known method can be appropriately used.

In addition, a plating layer may be provided by performing a plating step after (Step 4). For example, the plating layer can be provided on the surface of the heat dissipation member using a well-known method of electroless Ni—P plating or Ni—B plating. A preferable thickness and the like of the plating layer are as described above.

Hereinabove, the embodiment of the present invention has been described. However, the embodiment is merely an example of the present invention, and various configurations other than the above-described configurations can be adopted. In addition, the present invention is not limited to the above-described embodiments, and modifications, improvements, and the like within a range where the object of the present invention can be achieved are included in the present invention.

EXAMPLES

The embodiments of the present invention will be described in more detail based on Examples and Comparative Examples. The present invention is not limited to Examples.

Hereinafter, as described above, "main surface 2A" is a surface to be joined to a heat dissipation fin or the like and is curved to be convex in the outward direction instead of the inward direction of the heat dissipation member. In addition, "main surface 2B" is a surface to be connected to a component such as a power element.

<Manufacturing of Heat Dissipation Member>

Example 1

(Formation of Porous Silicon Carbide Body)

First, silicon carbide powder A, silicon carbide powder B, and silica sol described below were mixed with each other using a stirring mixer for 30 minutes to obtain a mixture.

Silicon carbide powder A (manufactured by Pacific Rundrum Co., Ltd.: NG-150, average particle size: 100 μm) 300 g Silicon carbide powder B (manufactured by Yakushima Denko Co., Ltd.: GC-1000F, average particle size: 10 μm) 150 g Silica sol (manufactured by Nissan Chemical Corporation: SNOWTEX) 30 g The obtained mixture was put into a mold and was pressed at a pressure of 10 MPa. As a result, a flat compact having a dimension of 185 mm×135 mm×5.5 mm was obtained. The obtained compact was calcinated in air at a temperature of 900° C. for 2 hours to obtain a porous silicon carbide body having a relative density (bulk density) of 65 vol %.

A surface of the porous silicon carbide body forming the main surface 2B of the heat dissipation member after completion was processed with a surface grinding machine. Next, a surface forming the main surface 2A was mechanically processed in a convex curved shape with a lathe of R=11 m. At this time, the thickness of the center of the porous silicon carbide body was adjusted to be 4.8 mm.

For the following step, 30 porous silicon carbide bodies having the same configuration were prepared.

(Impregnation with Metal)

Alumina fibers (manufactured by Tanaka Paper Co., Ltd., purity: 97%, sheet form) were disposed on the mechanically processed main surface 2A side of the porous silicon carbide body, both surfaces were interposed between carbon-coated stainless steel sheets having a dimension of 210 mm×160 mm×0.8 mm, and 30 bodies were laminated.

Next, iron sheets having a thickness of 6 mm were disposed on both sides and were fastened six M10 bolts lined to each other using a torque wrench such that the fastening torque in a planar direction was 3 Nm. As a result, one block was obtained.

Next, the integrated block was preheated to 620° C. in an electric furnace and subsequently was put into a press mold having an inner diameter of 400 mmφ that was heated in advance. Molten aluminum alloy containing 12 mass % of silicon and 1.0 mass % of magnesium was poured into the press mold, and the mold was pressurized at a pressure of 100 MPa for 20 minutes. As a result, the porous silicon carbide body was impregnated with the aluminum alloy.

After completion of the impregnation, the unit was cooled to 25° C. and was cut along a shape of the stainless steel sheets using a wet bandsaw to remove the interposed stainless steel sheets. Further, next, in order to remove strain during the impregnation, an annealing treatment was performed at a temperature of 500° C. for 3 hours.

As a result, an aluminum-silicon carbide composite was obtained.

(Treatment after Impregnation)

The outer periphery of the obtained aluminum-silicon carbide composite was processed with an NC lathe such that the lengths were 190 mm×140 mm. Next, in the peripheral portion, through holes having a diameter of 7 mm were formed at eight positions, and countersink holes having a diameter φ of 10-4 mm were formed at four positions.

In addition, a surface of the aluminum-silicon carbide composite corresponding to the main surface 2A was mechanically processed such that R=11 m at a turning center. After the mechanical processing, an annealing treatment was performed at a temperature of 500° C. for 4 hours in a muffle furnace. As a result, processing strain was removed.

Further, the aluminum-silicon carbide composite was blasted and cleaned with alumina abrasive grains under conditions of pressure: 0.4 MPa, transport speed: 1.0 m/min. Next, electroless Ni—P plating and Ni—B plating were performed. As a result, a plating layer having a thickness of 8 μm (Ni—P: 6 μm, Ni—B: 2 μm) was formed on the surface of the composite.

As a result, a heat dissipation member was obtained.

(Measurement of $f_1$ and $f_2$)

The flatness values of the main surface 2A and the main surface 2B of the obtained heat dissipation member were measured using a device VR-3000 (manufactured by Keyence Corporation) to obtain $f_1$ and $f_2$. At this time, the main surface 2A and the main surface 2B were not included in the field of view of the device. Therefore, a range of 190 mm×100 mm was measured such that the center (geometric center of gravity) of the main surface 2A/the main surface 2B in a top view matched the center of the field of view of the measuring device.

(Measurement of $h_1$ and $h_2$)

Using a laser three-dimensional shape measuring system, data relating to the shapes of the main surface 2A and the main surface 2B were obtained, and the data was analyzed to obtain $h_1$ and $h_2$.

Device: laser three-dimensional shape measuring system (hereinafter, a system obtained by integrating the following four devices)

XYθ stage unit: K2-300 (manufactured by Kohzu Precision Co., Ltd.)

High-accuracy laser displacement sensor: LK-G500 (manufactured by Keyence Corporation)

Motor controller: SC-200K (manufactured by Kohzu Precision Co., Ltd.)

AD converter: DL-100 (manufactured by Kohzu Precision Co., Ltd.)

(Measurement of RSm)

The average length RSm of roughness curve elements in the main surface 2A and the main surface 2B were measured using a device SJ-310 (manufactured by Mitutoyo Corporation) according to ISO4287-1997.

Examples 2 to 12

In Examples 2 to 12, heat dissipation members were prepared through the same steps as those of Example 1, except that the length of a long side and a short side of the heat dissipation member, the processing R in (Formation of Porous Silicon Carbide Body), and the processing R in (Treatment after Impregnation) and the like were changed. Next, various numerical values were measured using the same methods as those of Example 1.

Comparative Examples 1 to 3

Heat dissipation members were prepared through the same steps as those of Example 1, except that a surface of the porous silicon carbide body forming the main surface 2B of the heat dissipation member after completion was not processed with a surface grinding machine in (Formation of Porous Silicon Carbide Body), and the processing R in (Formation of Porous Silicon Carbide Body), the processing R in (Treatment after Impregnation) and the like were changed. Next, various numerical values were measured using the same methods as those of Example 1.

Supplementarily, a surface forming the main surface 2B of the heat dissipation member after completion was not processed with a surface grinding machine. Therefore, this surface was naturally curved to some extent during calcination and subsequent cooling.

Various numerical values are collectively shown in Tables 1 and 2.

In the tables, "E" in the columns "$h_1$/a" and "$h_2$/b" is an exponent notation. For example, 2.38E-03 represents 2.38×$10^{-3}$.

TABLE 1

| | Flatness (μm) | | | RSm(μm) | | Length a | Length b | | | | | |
|---|---|---|---|---|---|---|---|---|---|---|---|---|
| | Main Surface 2A | Main Surface 2B | | Main Surface | Main Surface | of Long Side | of Short Side | $h_1$ | $h_2$ | | | ($h_1$/a)/ |
| Example | $f_1$ | $f_2$ | $f_1 - f_2$ | 2A | 2B | (mm) | (mm) | (μm) | (μm) | ($h_1$/a) | ($h_2$/b) | ($h_2$/b) |
| 1 | 557 | 180 | 377 | 94 | 72 | 190 | 140 | 445 | 244 | 2.34E-03 | 1.74E-03 | 1.34 |
| 2 | 536 | 206 | 329 | 100 | 88 | 190 | 140 | 435 | 245 | 2.29E-03 | 1.75E-03 | 1.31 |
| 3 | 526 | 224 | 302 | 93 | 88 | 190 | 140 | 421 | 244 | 2.22E-03 | 1.74E-03 | 1.27 |
| 4 | 584 | 151 | 433 | 100 | 91 | 190 | 140 | 451 | 244 | 2.37E-03 | 1.74E-03 | 1.36 |
| 5 | 552 | 178 | 374 | 110 | 91 | 190 | 140 | 434 | 232 | 2.28E-03 | 1.65E-03 | 1.38 |
| 6 | 656 | 135 | 521 | 102 | 90 | 190 | 140 | 436 | 238 | 2.30E-03 | 1.70E-03 | 1.35 |
| 7 | 264 | 208 | 56 | 144 | 102 | 190 | 140 | 231 | 123 | 1.21E-03 | 8.81E-04 | 1.38 |
| 8 | 266 | 255 | 10 | 139 | 89 | 190 | 140 | 236 | 120 | 1.24E-03 | 8.60E-04 | 1.44 |
| 9 | 297 | 273 | 24 | 106 | 80 | 190 | 140 | 260 | 129 | 1.37E-03 | 9.25E-04 | 1.48 |
| 10 | 270 | 179 | 91 | 104 | 98 | 190 | 140 | 238 | 134 | 1.25E-03 | 9.58E-04 | 1.31 |

TABLE 1-continued

| | Flatness (μm) | | | RSm(μm) | | Length a | Length b | | | | | |
|---|---|---|---|---|---|---|---|---|---|---|---|---|
| Example | Main Surface 2A $f_1$ | Main Surface 2B $f_2$ | $f_1 - f_2$ | Main Surface 2A | Main Surface 2B | of Long Side (mm) | of Short Side (mm) | $h_1$ (μm) | $h_2$ (μm) | $(h_1/a)$ | $(h_2/b)$ | $(h_1/a)/(h_2/b)$ |
| 11 | 239 | 87 | 152 | 101 | 89 | 140 | 130 | 180 | 146 | 1.28E−03 | 1.13E−03 | 1.14 |
| 12 | 233 | 167 | 66 | 126 | 98 | 140 | 130 | 166 | 135 | 1.19E−03 | 1.04E−03 | 1.14 |

TABLE 2

| | Flatness (μm) | | | RSm(μm) | | Length a | Length b | | | | | |
|---|---|---|---|---|---|---|---|---|---|---|---|---|
| Comparative Example | Main Surface 2A $f_1$ | Main Surface 2B $f_2$ | $f_1 - f_2$ | Main Surface 2A | Main Surface 2B | of Long Side (mm) | of Short Side (mm) | $h_1$ (μm) | $h_2$ (μm) | $(h_1/a)$ | $(h_2/b)$ | $(h_1/a)/(h_2/b)$ |
| 1 | 378 | 482 | −104 | 113 | 118 | 190 | 140 | 281 | 165 | 1.48E−03 | 1.18E−03 | 1.26 |
| 2 | 382 | 574 | −193 | 106 | 102 | 190 | 140 | 294 | 171 | 1.55E−03 | 1.22E−03 | 1.27 |
| 3 | 367 | 392 | −25 | 89 | 87 | 190 | 140 | 274 | 161 | 1.44E−03 | 1.15E−03 | 1.25 |

<Evaluations such as Manufacturing Stability of Power Module>

10 heat dissipation members were prepared for each of Examples and Comparative Examples, and these members were connected to a simulated power element. As a result, a substrate for a simulated power module was manufactured.

As a specific manufacturing procedure, using a device that is typically used for manufacturing a power module, a ceramic substrate (substrate having both surfaces where a metal layer such as copper or aluminum was provided) was soldered to six specific positions of the main surface 2B among two main surfaces of the heat dissipation member according to each of Examples and Comparative Examples. As a result, a substrate for a simulated power module was obtained.

Next, in order to obtain a simulated power module, case providing, resin sealing, and cover providing were performed on the substrate for a simulated power module. As a result, a simulated power module was obtained.

The obtained simulated power module was investigated for whether or not a defect causing a problem relating to manufacturing was present.

In all the simulated power modules manufactured using the heat dissipation members according to Examples, a defect causing a problem relating to manufacturing was not present.

On the other hand, in the substrates for a simulated power module manufactured using the heat dissipation members according to Comparative Examples 1 to 3, a defect causing a problem relating to manufacturing, for example, unsuitable fitting of a jig for aligning the ceramic substrate or unsuitable fitting of a case after connection of the ceramic substrate was present in one sample among ten samples.

It can be seen from the results that the manufacturing stability (for example, yield) during power module manufacturing can be improved by using the plate-shaped heat dissipation member having the characteristics such as the satisfaction of the specific relationship between the flatness values of the two main surfaces.

For additional evaluations, the heat dissipation member according to each of Examples 1 to 12 was joined to a heat dissipation fin with a screw, and adhesion between the heat dissipation member and the heat dissipation fin, heat dissipation, and the like were evaluated. As a result, the adhesion and the heat dissipation were excellent.

That is, it can be seen that, by using the heat dissipation members according to Examples 1 to 12, a power module having excellent heat dissipation can be manufactured, and the yield and the like during the manufacturing of the power module can also be improved.

The present application claims priority based on Japanese Patent Application No. 2019-013762 filed on Jan. 30, 2019, the entire content of which is incorporated herein by reference.

The invention claimed is:

1. A plate-shaped heat dissipation member comprising a metal-silicon carbide composite impregnated with aluminum or magnesium,
   wherein at least one of two main surfaces of the heat dissipation member is curved to be convex in an outward direction of the heat dissipation member,
   when a flatness of the one main surface defined by JIS B 0621: 1984 is represented by $f_1$ and a flatness of the other main surface different from the one main surface defined by JIS B 0621: 1984 is represented by $f_2$, $f_2$ is less than $f_1$ by 10 μm or more,
   wherein the heat dissipation member is substantially rectangular, and
   when a length of a long side of the rectangle is represented by a and a length of a short side of the rectangle is represented by b,
   a straight line connecting middle points of two short sides of the one main surface is represented by $l_1$ and a straight line connecting middle points of two long sides of the one main surface is represented by $l_2$,
   a maximum distance between a point on a curve of the one main surface and $l_1$ in a cross-sectional view of the heat dissipation member showing a cross-section including $l_1$ and substantially perpendicular to the one main surface is represented by $h_1$, and a maximum distance between a point on a curve of the one main surface and $l_2$ in a cross-sectional view of the heat dissipation member showing a cross-section including $l_2$ and substantially perpendicular to the one main surface is represented by $h_2$, $$h_1/a \geq h_2/b.$$

2. The heat dissipation member according to claim 1, wherein a surface metal layer containing aluminum or magnesium is provided on the one main surface and/or the other main surface.

3. The heat dissipation member according to claim 1, wherein $f_1$ is 100 μm or more and 700 μm or less.

4. The heat dissipation member according to claim 1, wherein $f_2$ is 300 μm or less.

5. The heat dissipation member according to claim 1, wherein a value of $(h_1/a)/(h_2/b)$ is 1.00 or more and 1.9 or less.

6. The heat dissipation member according to claim 1, wherein an average length $RS_m$ of roughness curve elements of the other main surface is 50 μm or more and 200 μm or less.

7. A method of manufacturing the heat dissipation member according to claim 1, the method comprising:
- a step of preparing a plate-shaped metal-silicon carbide composite impregnated with aluminum or magnesium; and
- a step of mechanically processing a part of at least one surface of the composite to provide the one main surface.

8. A plate-shaped heat dissipation member comprising a metal-silicon carbide composite impregnated with aluminum or magnesium,
wherein at least one of two main surfaces of the heat dissipation member is curved to be convex in an outward direction of the heat dissipation member,
when a flatness of the one main surface defined by JIS B 0621: 1984 is represented by $f_1$ and a flatness of the other main surface different from the one main surface defined by JIS B 0621: 1984 is represented by $f_2$, $f_2$ is less than $f_1$ by 10 μm or more, and
wherein an average length $RS_m$ of roughness curve elements of the one main surface is 50 μm or more and 250 μm or less.

9. The heat dissipation member according to claim 8, wherein a surface metal layer containing aluminum or magnesium is provided on the one main surface and/or the other main surface.

10. The heat dissipation member according to claim 8, wherein $f_1$ is 100 μm or more and 700 μm or less.

11. The heat dissipation member according to claim 8, wherein $f_2$ is 300 μm or less.

12. The heat dissipation member according to claim 8, wherein the heat dissipation member is substantially rectangular, and
when a length of a long side of the rectangle is represented by a and a length of a short side of the rectangle is represented by b,
a straight line connecting middle points of two short sides of the one main surface is represented by $l_1$ and a straight line connecting middle points of two long sides of the one main surface is represented by $l_2$,
a maximum distance between a point on a curve of the one main surface and $l_1$ in a cross-sectional view of the heat dissipation member showing a cross-section including $l_1$ and substantially perpendicular to the one main surface is represented by $h_1$, and
a maximum distance between a point on a curve of the one main surface and $l_2$ in a cross-sectional view of the heat dissipation member showing a cross-section including $l_2$ and substantially perpendicular to the one main surface is represented by $h_2$, $$h_1/a \geq h_2/b.$$

13. The heat dissipation member according to claim 12, wherein a value of $(h_1/a)/(h_2/b)$ is 1.00 or more and 1.9 or less.

14. The heat dissipation member according to claim 8, wherein an average length $RS_m$ of roughness curve elements of the other main surface is 50 μm or more and 200 μm or less.

15. A method of manufacturing the heat dissipation member according to claim 8, the method comprising:
- a step of preparing a plate-shaped metal-silicon carbide composite impregnated with aluminum or magnesium; and
- a step of mechanically processing a part of at least one surface of the composite to provide the one main surface.

* * * * *